SEARCH ROOM
March 14, 1950
G. W. FYLER
SAW-TOOTH VOLTAGE GENERATOR
Original Filed Sept. 11, 1946
Re. 23,206
Orig. 2458,366
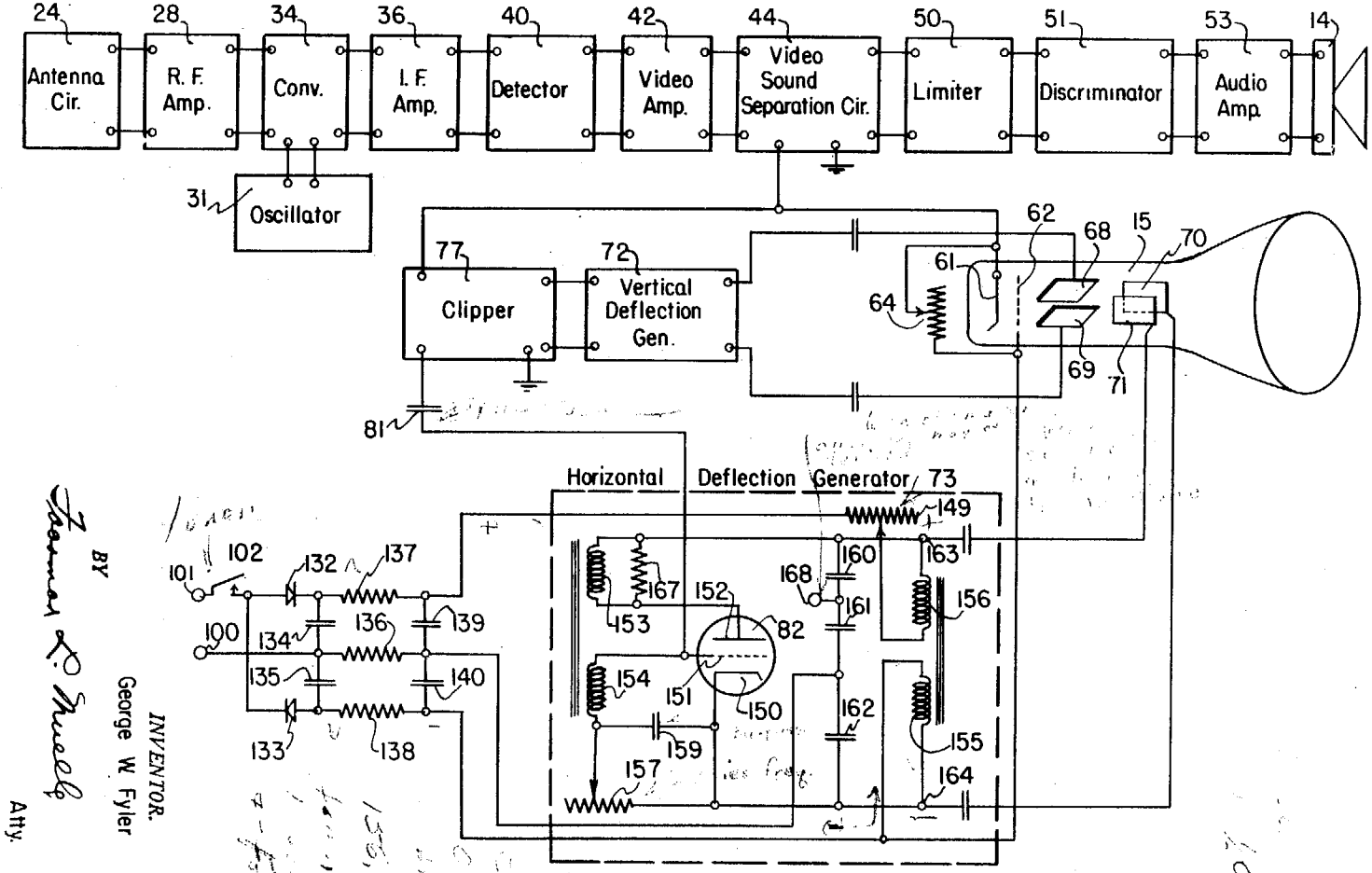
INVENTOR.
George W. Fyler
BY
Thomas L. Mueller
Atty.

SEARCH ROOM

Reissued Mar. 14, 1950

Re. 23,206

UNITED STATES PATENT OFFICE 23,206

SAW-TOOTH VOLTAGE GENERATOR

George W. Fyler, Lombard, Ill., assignor to Motorola, Inc., Chicago, Ill., a corporation of Illinois Original No. 2,458,366, dated January 4, 1949, Serial No. 20,250, April 10, 1948, which is a division of Serial No. 696,129, September 11, 1946. Application for reissue December 1, 1949, Serial No. 130,541

7 Claims. (Cl. 250—36)

Matter enclosed in heavy brackets [ ] appears in the original patent but forms no part of this reissue specification; matter printed in italics indicates the additions made by reissue

This invention relates generally to television receivers and in particular to a power supply system for producing the voltages required for operation of a television receiver including a cathode ray tube. This application is a division of my application Serial No. 696,129, filed September 11, 1946.

In prior television receivers it has been necessary to use relatively large amounts of current at high voltage to provide energy for operation of the cathode ray receiver tube and for deflecting the electron beam thereof. Also in most television receivers a relatively large number of amplifying stages are required which also draw current at high voltage. For the above reasons a power supply network has been necessary which is capable of producing very high voltages, and to provide such a supply a relatively large power transformer has generally been provided. Such a power transformer is objectionable because of the high cost thereof and also because of the size and weight added to the receiver.

Heretofore television receivers of conventional design have required power inputs of 300 watts or more. The large amount of power required prevented the placing of a receiver in a small cabinet because of the difficulty of keeping the components reasonably cool. Also hum effects from the power supply are more pronounced when the power transformer is near the picture tube. This further prevented placing the television receiver in a small cabinet.

An object of this invention is to provide a small television receiver having simple and efficient means for providing the potentials required for operation of the television receiver tube.

Another object of this invention is to provide an inexpensive television receiver having a power supply system which does not require a power transformer to reduce the cost of the receiver and to eliminate hum in the picture normally produced by the transformer.

A feature of this invention is the provision of a television receiver having a power network which does not require a power transformer.

A further feature of this invention is the provision of a horizontal deflection generator which operates from relatively low voltage direct current and produces a sawtooth output having a relatively large amplitude.

Further objects, features and advantages will be apparent from a consideration of the following description taken in connection with the accompanying drawing in which a schematic diagram of a television receiver utilizing the horizontal deflection generator in accordance with the invention is shown.

In practicing my invention I provide a television receiver of the superheterodyne type capable of receiving modulated composite video signals and sound signals and deriving video, synchronization, and sound signals therefrom. A simplified power supply network is used in which selenium rectifiers are used for energizing a system which operates at relatively low voltages. A horizontal deflection generator is provided which operates from the low voltage power supply and produces a sawtooth voltage of relatively high magnitude for causing the horizontal deflections of the electron beam. This is accomplished by reversely charging condensers so that a sawtooth voltage is developed thereacross.

In the drawings a schematic diagram of a television receiver of the superheterodyne type is shown. The various components of the receiver which are not a part of this invention are shown by block diagrams and the function thereof indicated therein. These components will not be described in detail but will be referred to in such a manner that the operation of the television receiver will be apparent. The receiver includes an antenna circuit 24 which may include a suitable antenna such as a dipole. The signals picked up by the antenna circuit are then amplified in the tuned radio frequency amplifier 28. A local oscillator 31 is provided for producing oscillations for converting the radio frequency signals into intermediate frequency signals in converter 34. Switching means for these units may be ganged together so that by a single operation, the antenna, radio frequency amplifier, and oscillator are tuned to the desired frequencies.

For the purpose of selectively amplifying the intermediate frequencies, an intermediate frequency amplifier 36 is provided. The video and sound intermediate frequency signals are both passed through the intermediate frequency amplifier 36 and are separated after passing through the video amplifier as is explained in my copending application Serial No. 676,651, filed June 14, 1946, subject Television receiver circuit. The amplified intermediate frequency signals are applied to detector 40 wherein the video and sound frequency signals are derived. These signals are then amplified in video amplifier 42. The amplified video and sound signals are separated in the video and sound separation circuit 44 with the video signal being applied to the cathode ray tube 15 and the clipper 77, and the sound signal being applied to the limiter 50. The sound signal is then applied to the discriminator 51 and audio amplifier 53 and is reproduced in loud speaker 14.

The composite video signal is applied to the cathode 61 of the cathode ray tube 15. The control grid 62 of the tube may be connected to the negative side of the power supply and the cathode may be biased with respect thereto through variable resistor 64, the resistor being variable to control the intensity of the cathode ray beam and thereby the brightness of the image produced. Electrostatic deflection is utilized in the tube, the vertical deflection being controlled by plates 68 and 69 and horizontal deflection by the plates 70 and 71. Potentials for causing vertical deflection are applied to the plates by vertical deflection generator 72 and potentials for horizontal deflection are produced by horizontal deflection generator 73. The clipper functions to derive the synchronization pulses from the composite video signal, the derived pulses being applied to the generators 72 and 73 to control the sawtooth voltage waves produced thereby.

The television receiver in accordance with the invention is adapted to be energized from the standard 110 volt alternating current household power supply. In order to provide the power required for operation of the television receiver energy must be available for supplying the heaters for the cathodes of the various tubes and also high potential direct current of various voltages must be available for providing the plate and screen voltages necessary for the tubes and for providing the potentials required for focusing and deflecting the beam of the cathode ray tube. The power supply system in accordance with the invention includes terminals 100 and 101 adapted to be connected to a source of 110 volts alternating current, a power switch 102 being included for controlling the energization of the system. The connection from terminal 101 continues through switch 102 to a pair of selenium rectifiers 132 and 133. The selenium rectifiers are connected so that the positive portion of the alternating current cycle is rectified by rectifier 132 and appears across condenser 134 which is connected between the rectifier 132 and the terminal 100 which forms the other side of the alternating current source. The rectifier 133 is connected to pass only negative currents so that a negative potential appears across condenser 135 connected between rectifier 133 and the common terminal. It is apparent that there will be relatively large 60 cycle ripple in the voltages across each of the condensers 134 and 135. However, the ripple in the voltages will be out of phase so that the combined potential across the two condensers will have a 120 cycle ripple which will be of much smaller magnitude than the 60 cycle ripple across each condenser. It is obvious that by completely eliminating the center wire the 60 cycle ripple would be thereby eliminated. However, substantially the same effect can be obtained by retaining the center wire and placing a relatively large resistor 136 therein to reduce the effect of the 60 cycle ripple. Resistors 137 and 138 are provided in the positive and negative wires and condensers 139 and 140 are provided across the positive and negative branches, respectively, of the power supply to provide stable operating potentials. Although the power supply system is illustrated as connected only to the horizontal deflection generator 73, it is apparent that it can also be used to energize the other components of the television receiver.

Referring now more specifically to the horizontal deflection generator 73, the generator includes a triode tube 82 which functions as a blocking oscillator. The tube includes a cathode 150, grid 151 and plate 152. The plate and grid are connected to the windings 153 and 154 of a transformer in a manner to provide regeneration therebetween. A damping resistor 167 is shown connected across winding 153 and a similar damping resistor may be provided across winding 154. The grid is also connected to coupling condenser 81 to receive synchronization pulses therefrom. The negative side of the power supply network is connected through choke coil 155 to the cathode 150 and the plate is connected to the positive wire through choke coil 156 and variable resistor 149. The coils 155 and 156 are mounted on a common core and are so wound and connected that the inductance between points 163 and 164 is a maximum. It is seen that the total power supply voltage can be applied to the horizontal deflection generator, or the voltage can be reduced by resistor 149 to reduce thereby the amplitude of the generator output. The frequency of the oscillator can be controlled by changing the bias on grid 151 as by adjusting resistor 157. Condenser 159 acts as a by-pass for resistor 157. A series circuit is provided between the terminals of the power supply through the choke coils 155 and 156 and condensers 160, 161 and 162. The coils are preferably identical and as they are wound so that the inductances thereof are additive, the total inductance is four times that of either coil. In order that the system is balanced the total capacitance of the condensers 160 and 161 in series is made substantially equal to the capacitance of condenser 162 and the common connection therebetween is connected to the center wire of the power supply. The two condensers 160 and 161 are provided so that a sawtooth voltage of smaller amplitude can be derived from terminal 168 if desired, as for exciting a high voltage power supply.

In operation, the blocking oscillator circuit, including windings 153 and 154 the condensers 160, 161 and 162 and the stray circuit capacities, is adjusted to a high frequency substantially five times that of the horizontal synchronization pulses. More specifically, when the tube 82 conducts, a series circuit is formed through winding 153 and condensers 160, 161 and 162 which is resonant at a frequency substantially five times that of the horizontal synchronization pulses. The choke coils 155 and 156 and condensers 160, 161 and 162 are so chosen that the series circuit through these components will be resonant at a relatively low frequency, a frequency one-tenth that of the horizontal scanning frequency being suitable. As the coil 156 is connected to the positive wire of the power supply and the coil 155 is connected to the negative wire, the current through this circuit will cause the condensers 160, 161 and 162 to charge so that the point 163 becomes positive and the point 164 becomes negative. It is noted that this will cause a positive potential on the plate 152 which tends to cause the tube to conduct. When the tube 82 conducts a heavy plate current will flow through the high frequency series resonant circuit producing current through the condensers 160, 161 and 162 in an opposite direction to that produced by the power supply. The transfer of energy through the windings 153 and 154 will render the tube 82 highly conductive. The blocking oscillator circuit is arranged so that the tube 82 will conduct for one-half cycle which will cause the point 163

SEARCH ROOM to become negative and the point 164 to become positive. Said tube therefore operates as a circuit charging means. As the natural frequency of the series circuit through the chokes and condensers is relatively slow the voltage thereacross will build up linearly until interrupted when the tube 82 conducts. This provides the trace portion of the cycle. The bias of the oscillator will be adjusted so that the tube is just about to conduct when a synchronization pulse is received so that the pulse will start the retrace action. As the natural frequency of the blocking oscillator is very fast the retrace period will be fast as is desired. If the frequency of the oscillator is five times the frequency of the horizontal pulses as stated, since the retrace is only one-half a cycle the time required for the retrace would be one-tenth of the total time of one horizontal deflection cycle. The reversing potentials on points 163 and 164 are applied through condensers 165 and 166 to the horizontal deflecting plates 70 and 71, respectively. The voltage appearing on each plate will swing from positive to negative values and vice versa to thereby provide a relatively large balanced sawtooth voltage across the deflecting plates 70 and 71.

In a specific model constructed in accordance with the invention, with standard 110 volt alternating current power applied to the terminals 100 and 101 of the power supply, voltages of approximately 130 volts were produced between the positive and negative wires and the center wire of the power supply, thus making the total voltage between the negative and positive wires approximately 260 volts. When using one section of a 12SN7 tube as the blocking oscillator in the horizontal deflection generator 73, and applying the entire 260 volts thereto, voltages varying plus and minus approximately 300 volts were obtained across the sides of the horizontal deflection generator circuit thereby providing a sweep voltage having an amplitude of 600 volts for deflection of the cathode ray beam in a horizontal direction. This voltage was ample for operating a seven inch direct viewing cathode ray tube such as type 7GP4.

As previously stated, horizontal synchronization pulses are applied to the generator from the clipper 77 through coupling condenser 81 to the grid 151 of tube 82. This signal is applied across the winding 154 of the blocking oscillator transformer which acts as a filter to further select the horizontal synchronization pulses. By properly tuning the coil 154 a series resonant circuit having a very sharp characteristic can be provided.

It is seen from the above that I have provided a simple horizontal deflection generator which is effective to provide balanced sawtooth voltages of relatively high amplitude from a low voltage power supply source. Only a single triode tube section is required in the generator so that the cost thereof is very small. The trace portion of the voltage wave is linear and the retrace portion is relatively fast so that the resulting wave is highly satisfactory for providing deflection voltages.

Although I have illustrated one specific embodiment of my invention, it is apparent that various changes and modifications can be made therein which fall within the intended scope of the invention as defined in the appended claims.

I claim:

[1. In a television receiver including a cathode ray tube having horizontal and vertical deflection electrodes for deflecting the electron beam of said tube and means for deriving synchronization pulses for controlling the deflection of said beam, a generator for providing sawtooth voltages for said horizontal deflection electrodes comprising an electron discharge valve having input and output electrodes, a transformer having a pair of windings, a plurality of condensers, a pair of equal inductances, a source of potential, said inductances and condensers being connected in series across said source of potential, said input and output electrodes of said valve being coupled through said windings of said transformer, said output electrodes of said valve being connected across said condensers so that the voltage built up on said condensers because of current flowing from said source of potential is applied thereto, said valve being arranged to conduct when a predetermined potential is applied to said output electrodes to provide current through said condenser in a direction opposite to the current flow caused by said source of potential to thereby charge said condensers in the opposite direction, and means for applying said synchronization pulses to the input terminals of said valve to cause said valve to conduct at a predetermined time.]

[2. A voltage generator adapted to produce a sawtooth voltage wave comprising condenser means, a pair of equal closely coupled inductances, a source of potential, and a blocking oscillator including an electron discharge valve, said inductances and said condenser means being connected in series across said source of potential and being of such value that a series circuit resonant at a relatively low frequency is provided for charging said condenser means in one direction, said electron discharge valve being connected across said condenser means and being biased to conduct when a predetermined potential is applied thereto, said blocking oscillator having a relatively high frequency and being arranged so that said valve is blocked after an oscillation of one-half cycle duration so that said condenser means is discharged and then charged in the opposite direction.]

[3. A voltage generator adapted to produce a sawtooth voltage wave comprising condenser means, a pair of equal closely coupled inductances, a source of potential, and a blocking oscillator including an electron discharge valve, said inductances and said condenser means being connected in series across said source of potential for charging said condenser means in one direction, said inductors providing a steady charging current whereby said condenser means charge to a voltage greater than the voltage of said source, said electron discharge valve being connected across said condenser means and being biased to conduct when a predetermined potential is applied thereto, said blocking oscillator having a relatively high frequency and being arranged so that said valve is blocked after an oscillation of one-half cycle duration so that said condenser means is discharged and then charged to substantially the same voltage in the opposite direction.]

4. A voltage generator adapted to produce a sawtooth voltage wave comprising condenser means, a pair of equal closely coupled inductances, a source of potential, and a blocking oscillator including an electron discharge valve, said inductances and said condenser means being connected in series across said source of potential for charging said condenser means in one direction, said inductors providing a steady charging current whereby said condenser means charge to a voltage greater than the voltage of said source, said blocking oscillator being connected across said condenser means for applying the voltage on said condenser means to said valve, said blocking oscillator and said condenser means forming a series circuit resonant at a relatively high frequency when said valve conducts, said valve being blocked after an oscillation of one-half cycle duration so that said condenser means is discharged and then charged to substantially the same voltage in the opposite direction, so that the sawtooth voltage wave developed across said condenser means has an amplitude variation greater than twice the voltage of said source.

[5. A voltage generator adapted to produce a sawtooth voltage wave of a predetermined frequency comprising, a plurality of condensers, a pair of equal closely coupled inductances, a source of potential, and a blocking oscillator including an electron discharge valve, said inductances and condensers being connected in series across said source of potential and being of such value that the series circuit is resonant at a frequency of the order of one-tenth that of said predetermined frequency, said electron discharge valve being connected across said condensers so that the voltage built up on said condensers because of current flowing from said source of potential is applied thereto, said valve being biased to conduct when a predetermined potential is applied thereto to cause current to flow through said condensers in a direction opposite to the current flow caused by said source of potential, said blocking oscillator having a frequency of the order of five times that of said predetermined frequency and being arranged so that said valve conduits during an oscillation of one-half cycle so that said condensers are rapidly discharged and then charged in the opposite direction.]

[6. A sawtooth voltage generator comprising condenser means, a pair of equal closely coupled inductances a source of potential, and a blocking oscillator including an electron discharge valve having input and output electrodes and a transformer having windings coupling said electrodes, said condenser means being connected intermediate said inductances in series across said source of potential, said output electrodes of said valve being connected in series with one of said transformer windings across said condenser means so that the voltage built up thereacross is applied to said valve, said valve being biased to conduct when a predetermined potential is applied thereto to provide a high frequency series resonant circuit through said condenser means and said one winding permitting the flow of current through said condenser means in a direction opposite to current flow caused by said source of potential, said transformer providing energy to said input electrodes to render said valve highly conducting, said valve being blocked when an oscillation of one-half cycle has taken place so that said condenser means is discharged and then charged in the opposite direction.]

[7. A sawtooth voltage generator comprising a plurality of condensers, a pair of equal inductances, a source of potential, and a blocking oscillator including an electron discharge valve having input and output electrodes and a transformer having a pair of windings coupling said electrodes, said inductances and said condensers being connected in series across said source of potential, said output electrodes of said valve being connected across said condensers so that the voltage built up thereacross because of current flowing from said power supply is applied to said valve, said valve being biased to conduct when a predeterminated potential is applied thereto to provide current through said condensers in a direction opposite to current flow caused by said source of potential, said blocking oscillator being arranged so that transfer of energy through said transformer from said output electrodes to said input electrodes blocks said valve when an oscillation of one-half cycle has taken place to discharge said condensers and then charge said condensers in the opposite direction.]

[8. A voltage generator adapted to produce a sawtooth voltage wave comprising, condenser means, a pair of equal closely coupled inductances, a source of potential, and a blocking oscillator including an electron discharge valve, said inductances and said condenser means being connected in series across said source of potential and being of such value that a series circuit resonant at a relatively low frequency is provided so that voltage is built up on said condenser means at a uniform rate to provide a substantially linear trace, said electron discharge valve being connected across said condenser means so that the voltage thereon is applied to said valve to render said valve to conduct when said voltage reaches a predetermined value, said blocking oscillator being tuned to resonate with said condenser means at a relatively high frequency to form a high frequency resonant circuit through which said condenser means discharges when said valve conducts, said valve being blocked after an oscillation of one-half cycle duration so that said condenser means is rapidly discharged and then charged in the opposite direction to provide a fast retrace.]

[9. A voltage generator adapted to produce a sawtooth voltage wave of a predetermined frequency comprising, condenser means, a pair of equal closely coupled inductances, a source of potential, and a blocking oscillator including an electron discharge valve, said inductances and said condenser means being connected in series across said source of potential and being of such value that the series circuit is resonant at a frequency of the order of one-tenth that of said predetermined frequency, so that voltage is built up on said condenser means at a uniform rate to provide a substantially linear trace, said blocking oscillator being connected across said condenser means so that the voltage on said condenser means is applied to said electron discharge valve to cause said valve to conduct when said voltage reaches a predetermined value, said blocking oscillator being tuned to resonate with said condenser means at a frequency of the order of five times that of said predetermined frequency when said valve conducts, said valve being arranged to conduct for an oscillation of one-half cycle so that said condenser means is rapidly discharged and then charged in the opposite direction to provide a fast retrace.]

[10. A sawtooth voltage generator adapted to produce sawtooth voltage waves comprising, a pair of equal condenser means, a pair of equal closely coupled inductances, a source of potential, and a blocking oscillator including an electron discharge valve, said condenser means being connected intermediate said inductances in series across said source of potential and being of such value that a series circuit resonant at a relatively low frequency is provided so that voltage is built up on said condenser means at a uniform rate

SEARCH ROOM to provide a substantially linear trace, said blocking oscillator being connected across said condenser means so that the voltage on said condenser means is applied to said valve to cause said valve to conduct when said voltage reaches a predetermined value, said blocking oscillator being tuned to resonate with said condenser means at a relatively high frequency and arranged so that said valve conducts for one-half cycle so that said condenser means is rapidly discharged and then charged in the opposite direction to provide a fast retrace, whereby balanced sawtooth voltage waves are developed across said pair of condenser means.]

[11. In a television receiver including a cathode ray tube having horizontal and vertical deflection electrodes for deflecting the electron beam of said tube and means for deriving synchronization pulses for controlling the deflection of said beam, a generator for providing sawtooth voltages for said horizontal deflection electrodes comprising a pair of condenser means, a pair of equal inductances, a source of potential, a blocking oscillator including an electron discharge valve and a transformer including a pair of windings, said inductances and condenser means being connected in series across said source of potential, said valve being connected across said condenser means so that the voltage built up thereon because of current flowing from said source of potential is applied to said valve, said valve being arranged to conduct when a predetermined potential is applied to said output electrodes to provide current through said condenser means in a direction opposite to the current flow caused by said source of potential, said blocking oscillator being so arranged that said valve conducts during one-half cycle of said oscillator so that said condenser means are discharged and then charged in the opposite direction, and means for applying said synchronization pulses to said valve across one of said windings to cause said valve to conduct at a predetermined time.]

12. In a television receiver including a cathode ray tube having horizontal and vertical deflection electrodes for deflecting the electron beam of said tube and means for deriving synchronization pulses for controlling the deflection of said beam, a generator for providing sawtooth voltages for said horizontal deflection electrodes comprising a plurality of condensers, a pair of equal inductances, a source of potential, a blocking oscillator including an electron discharge valve having input and output electrodes and a transformer having a pair of windings coupling said electrodes, said inductances and condensers being connected in series across said source of potential, said output electrodes of said valve being connected across said condensers so that the voltage built up thereacross because of current flowing from said source of potential is applied to said valve, and means for applying said synchronization pulses across one of said windings to said input electrodes to cause said valve to conduct to provide current through said condenser in a direction opposite to the current flow caused by said source of potential, said one winding being tuned to act as a filter for said synchronization pulses, said blocking oscillator being so arranged that transfer of energy through said transformer blocks said valve when an oscillation of one-half cycle has taken place.

[13. The method of producing a sawtooth voltage wave across condenser means which is connected to a blocking oscillator including an electron discharge valve and a transformer having primary and secondary windings, said method comprising the steps of, charging said condenser means to one polarity at a uniform rate, discharging said condenser means and storing energy therefrom in said primary winding, transferring energy from said primary winding to said secondary winding to render said valve more conductive, charging said condenser to the polarity opposite to said one polarity by the energy stored in said primary winding, and utilizing said valve to prevent transfer of current between said primary winding and said condenser means for a succeeding linear charging step.]

[14. A sawtooth voltage generator circuit for producing a sawtooth voltage wave of one frequency comprising, condenser means, means for charging said condenser means at a uniform rate, an electron discharge valve having input and output electrodes, a transformer having primary and secondary windings, said output electrodes of said valve and said primary winding being connected across said condenser means and forming a series circuit thereby in which oscillation can take place when said valve conducts, said series circuit being resonant at a frequency at least five times said one frequency, said secondary winding being connected to said input electrodes of said valve to transfer energy thereto for rendering said valve more conductive.]

[15. A sawtooth voltage generator circuit comprising, condenser means, means for charging said condenser means at a uniform rate, an electron discharge valve having input and output electrodes, a transformer having primary and secondary windings, said output electrode of said valve and said primary winding being connected across said condenser means and forming a series resonant circuit thereby in which oscillations can take place when said valve conducts, said secondary windings being connected to said input electrodes of said valve to transfer energy thereto for rendering said valve more conductive.]

16. A sawtooth voltage generator circuit for producing a sawtooth voltage wave of one frequency comprising, condenser means, means for charging said condenser means at a uniform rate, an electron discharge valve having input and output electrodes, a transformer having primary and secondary windings, a damping resistor connected across said primary winding, said output electrodes of said valve and said primary winding being connected across said condenser means and forming a series circuit thereby in which oscillations can take place when said valve conducts, said series circuit being resonant at a frequency at least five times said one frequency, said secondary winding being connected to said input electrodes of said valve to transfer energy thereto for rendering said valve highly conductive.

[17. A sawtooth voltage generator circuit for producing a sawtooth voltage wave of one frequency comprising, condenser means, means for charging said condenser means at a uniform rate, and a blocking oscillator including an electron discharge valve and a transformer having a pair of windings, said valve being connected in series with one of said windings to said condenser means and forming a series circuit in which oscillations can take place when said valve conducts, said series circuit being resonant at a frequency at least five times said one frequency, said one winding providing energy to said blocking oscillator to render said valve more conductive, said valve operating to disconnect said inductance means from said condenser means when said resonant circuit has completed one-half cycle of an oscillation.]

*18. A sawtooth voltage generator circuit for producing a sawtooth voltage wave of a predetermined frequency comprising condenser means having at least two terminals, means including inductance means connected in series with said condenser means for charging said condenser means at a uniform rate, a blocking oscillator including an electron discharge valve, a transformer and frequency controlling means for said oscillator, said valve having a cathode, a plate, and a grid, said transformer having primary and secondary windings, and a damping resistor connected across said primary winding, said primary winding being connected directly between said plate of said valve and one terminal of said condenser means, said cathode of said valve being connected directly to the other terminal of said condenser means, said secondary winding being connected in series with said frequency controlling means between said grid and said cathode of said valve to transfer energy to said grid for rendering said valve highly conductive, the inductance of said primary winding and the capacity of said condenser means being so related that the series circuit formed thereby when said valve conducts is resonant at a frequency at least five times said predetermined frequency.*

*19. A sawtooth voltage generator circuit for producing a sawtooth voltage wave having trace and retrace portions, said generator comprising condenser means having at least two terminals, a source of potential, means including inductance means connecting said condenser means to said source of potential for charging said condenser means at a uniform rate to a voltage greater than the voltage of said source to thereby form said trace portions of said sawtooth voltage wave, a blocking oscillator including an electron discharge valve, a transformer and frequency controlling means, said valve including a cathode, a plate, and a grid, said transformer including primary and secondary windings, and a damping resistor connected across said primary winding, said primary winding being connected directly between said plate of said valve and one terminal of said condenser means, said cathode of said valve being connected directly to the other terminal of said condenser means, said secondary winding being connected in series with said frequency controlling means between said grid and said cathode of said valve to transfer energy to said grid for rendering said valve highly conductive, a closed series circuit consisting of said primary winding, said condenser means and the plate-cathode path of said valve being formed in which oscillations of one-half cycle take place when said valve conducts to reverse the charge on said condenser means and thereby form the retrace portions of said sawtooth voltage wave.*

*20. A sawtooth voltage generator circuit for producing a sawtooth voltage wave of one frequency comprising, condenser means, means for charging said condenser means at a uniform rate, an electron discharge valve having input and output electrodes, a transformer having primary and secondary windings, a damping resistor connected across said primary winding, said output electrodes of said valve and said primary winding being connected in series directly across said condenser means so that when said valve conducts a closed series circuit consisting of said primary winding and said condenser means is formed in which an oscillation of one-half cycle takes place to discharge said condenser means and charge the same to the opposite polarity, the inductance of said primary winding and the capacity of said condenser means being so related that said series circuit is resonant at a frequency at least five times said one frequency, said secondary winding being connected to said input electrodes of said valve to transfer energy thereto for rendering said valve highly conductive.*

*21. A sawtooth voltage generator circuit for a television receiver which includes a cathode ray tube having horizontal and vertical deflection electrodes for deflecting the electron beam of the tube and means for deriving synchronization pulses for controlling the deflection of the beam, said sawtooth voltage generator circuit producing a sawtooth voltage wave having trace and retrace portions, said generator comprising condenser means having at least two terminals, a source of potential, inductance means connecting said condenser means to said source of potential for charging said condenser means at a uniform rate to a voltage greater than the voltage of said source to thereby form said trace portions of said sawtooth voltage wave, a blocking oscillator including an electron discharge valve, a transformer and frequency controlling means, said electron discharge valve having a cathode, a plate, and a grid, said transformer having primary and secondary windings, a damping resistor connected across said primary winding, said primary winding being connected directly between said plate of said valve and one terminal of said condenser means, said cathode of said valve being connected directly to the other terminal of said condenser means, said secondary winding being connected in series with said frequency controlling means between said grid and said cathode of said valve for transferring energy to said grid, and means for applying synchronization pulses across said secondary winding for rendering said valve conductive, said primary winding, said condenser means and the plate-cathode path of said valve together forming a closed series circuit in which oscillations of one-half cycle take place when said valve conducts to reverse the charge on said condenser means and form the retrace portions of said sawtooth voltage wave.*

GEORGE W. FYLER.

REFERENCES CITED

The following references are of record in the file of this patent or the original patent:

UNITED STATES PATENTS

| Number | Name | Date |
|---|---|---|
| 2,063,025 | Blumlein | Dec. 8, 1936 |
| 2,105,902 | Cawein | Jan. 18, 1938 |
| 2,168 508 | Barthelemy | Aug. 8, 1939 |
| 2,180,365 | Norton | Nov. 21 1939 |
| 2,188,653 | Faudell | Jan. 30, 1940 |
| 2,207,940 | Norton | July 16, 1940 |
| 2,244,003 | Eaglesfield et al. | June 3, 1941 |
| 2,259,284 | Baldwin, Jr. | Oct. 14, 1941 |
| 2,264,781 | Wheeler | Dec. 2, 1941 |
| 2,297,742 | Campbell | Oct. 6, 1942 |
| 2,383,333 | Milward | Aug. 21, 1945 |
| 2,412,210 | Edson et al. | Dec. 10, 1946 |